United States Patent
Aurongzeb et al.

(10) Patent No.: US 9,720,459 B2
(45) Date of Patent: Aug. 1, 2017

(54) CARBON-FIBER CHASSIS OF AN INFORMATION HANDLING SYSTEM

(71) Applicant: Dell Products L.P., Round Rock, TX (US)

(72) Inventors: Deeder M. Aurongzeb, Round Rock, TX (US); Travis C. North, Cedar Park, TX (US); Kyle D. Spiess, Cedar Park, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 14/930,403

(22) Filed: Nov. 2, 2015

(65) Prior Publication Data

US 2016/0054764 A1  Feb. 25, 2016

Related U.S. Application Data

(62) Division of application No. 13/753,248, filed on Jan. 29, 2013, now Pat. No. 9,198,309.

(51) Int. Cl.
| | |
|---|---|
| *H01L 23/473* | (2006.01) |
| *H01L 23/467* | (2006.01) |
| *G06F 1/20* | (2006.01) |
| *G06F 1/18* | (2006.01) |
| *H05K 5/02* | (2006.01) |
| *G06F 1/16* | (2006.01) |

(52) U.S. Cl.
CPC ............ *G06F 1/182* (2013.01); *G06F 1/1656* (2013.01); *G06F 1/20* (2013.01); *G06F 1/203* (2013.01); *H01L 23/467* (2013.01); *H01L 23/473* (2013.01); *H05K 5/0213* (2013.01); *Y10T 29/49801* (2015.01); *Y10T 156/1056* (2015.01)

(58) Field of Classification Search
CPC ....... H01L 2924/00; H01L 2224/32145; H01L 2224/32225; H01L 23/473; H01L 23/467; Y10T 428/24995; Y10T 428/249946; G06F 1/203; G06F 1/20; G06F 1/1656; G06F 1/206

See application file for complete search history.

(56) References Cited

U.S. PATENT DOCUMENTS

| | | | |
|---|---|---|---|
| 5,827,585 A | 10/1998 | Giannetti | |
| 6,002,584 A | 12/1999 | Messmer et al. | |
| 6,106,646 A | * 8/2000 | Fairbanks | ........... B29C 66/8322 156/253 |

(Continued)

FOREIGN PATENT DOCUMENTS

JP  2004107626 A  4/2004  ................ C08J 5/08

OTHER PUBLICATIONS

Tjerkstra et al.; "Etching Technology for Microchannels"; Micro Electro Mechanical Systems, 1997. MEMS '97, Proceedings, IEEE., Tenth Annual Workshop on, pp. 147-152, w/abstract, 1997.

(Continued)

*Primary Examiner* — Adam B Dravininkas
(74) *Attorney, Agent, or Firm* — Baker Botts L.L.P.

(57) ABSTRACT

A chassis and a method of manufacturing a chassis of an information handling system are disclosed. The chassis includes a carbon-fiber composite and a plurality vents of formed in the carbon-fiber composite. Each of the plurality of vents is a channel extending through the carbon-fiber composite.

6 Claims, 6 Drawing Sheets

(56) References Cited

U.S. PATENT DOCUMENTS

| | | | |
|---|---|---|---|
| 6,265,076 B1 | 7/2001 | McCurdy et al. | |
| 7,173,822 B2 | 2/2007 | Liang et al. | |
| 7,609,517 B2* | 10/2009 | Sun | H05K 7/20727 361/690 |
| 8,021,752 B2 | 9/2011 | Honda et al. | |
| 8,324,515 B2 | 12/2012 | Stevenson et al. | |
| 2007/0177348 A1* | 8/2007 | Kehret | H05K 7/1434 361/690 |
| 2008/0026179 A1 | 1/2008 | Shiao et al. | |
| 2008/0166511 A1 | 7/2008 | Honma et al. | |
| 2009/0185340 A1* | 7/2009 | Ji | B29C 45/14786 361/679.21 |
| 2009/0233044 A1* | 9/2009 | Sun | B29C 45/14811 428/113 |
| 2010/0098906 A1* | 4/2010 | Bongiovanni | B29C 37/0064 428/138 |
| 2010/0321891 A1* | 12/2010 | Steenwyk | H05K 7/20545 361/707 |
| 2011/0290685 A1 | 12/2011 | Kenney | |
| 2011/0310553 A1 | 12/2011 | Hsiao | |
| 2012/0021196 A1 | 1/2012 | Kenney | |
| 2012/0057297 A1 | 3/2012 | Merz et al. | |
| 2012/0058297 A1* | 3/2012 | Arai | C08J 5/24 428/98 |
| 2012/0058325 A1 | 3/2012 | Honma et al. | |
| 2012/0087088 A1 | 4/2012 | Killion et al. | |
| 2014/0184044 A1* | 7/2014 | Gwin | B29C 70/506 312/223.2 |

OTHER PUBLICATIONS

Li et al.; "Very-low-Re chaotic motions of viscoelastic fluid and its unique applications in microfluidic devices: A review"; Experimental Thermal and Fluid Science 39; pp. 1-16, 2012.

* cited by examiner

CARBON-FIBER CHASSIS OF AN INFORMATION HANDLING SYSTEM

CROSS-REFERENCE TO RELATED APPLICATION

The present application is a divisional application of U.S. patent application Ser. No. 13/753,248 filed Jan. 29, 2013, the contents of which are hereby incorporated by reference in its entirety for all purposes.

TECHNICAL FIELD

The present disclosure relates generally to information handling systems, and more particularly to a vent area for a carbon-fiber chassis of an information handling system.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

An information handling system may include a chassis, which serves as a frame or base for the physical components of the system. The components of the information handling system may be positioned on or enclosed within the chassis. An important consideration in the operation of an information handling system is cooling the components enclosed within the chassis. Excessive heat within the chassis can harm the operation of the components of the information handling system. Accordingly, air movers (e.g., cooling fans and blowers) have often been used in conjunction with vent areas to dissipate or evacuate heat generated by the components.

SUMMARY

In one embodiment, a chassis of an information handling system, the chassis is disclosed. The chassis includes a carbon-fiber composite and a plurality vents of formed in the carbon-fiber composite. Each of the plurality of vents is a channel extending through the carbon-fiber composite.

In another embodiment, a chassis of an information handling system is disclosed. The chassis includes a carbon-fiber composite, a vent area insert coupled to the carbon-fiber composite, a plurality vents of formed in the vent area insert. Each of the plurality of vents is a channel extending through the vent area insert.

In yet another embodiment, a method of manufacturing a chassis of an information handling system is disclosed. The method includes the steps of determining a desired size, shape, and orientation of a plurality of vents, and forming a plurality of holes in a plurality of carbon-fiber layers, where each of the plurality of holes corresponds to one of the plurality of vents. The method further includes the steps of aligning the plurality of carbon-fiber layers such that the holes in each layer have the desired alignment relative to the holes in an adjacent layer, and bonding the plurality of carbon-fiber layers to form a carbon-fiber composite.

In still another embodiment, a method of manufacturing a chassis of an information handling system is disclosed. The method includes the steps of creating a vent area insert, the vent area insert including a plurality of vents and creating a cutout in a carbon-fiber composite, the cutout sized to receive the vent area insert. The method further includes the steps of inserting the vent area insert into the cutout in the carbon-fiber composite, and coupling the vent area insert to the carbon-fiber composite.

BRIEF DESCRIPTION OF THE DRAWINGS

A more complete understanding of the disclosed embodiments and advantages thereof may be acquired by referring to the following description taken in conjunction with the accompanying drawings, in which like reference numbers indicate like features, and wherein.

DETAILED DESCRIPTION

Figure 1:
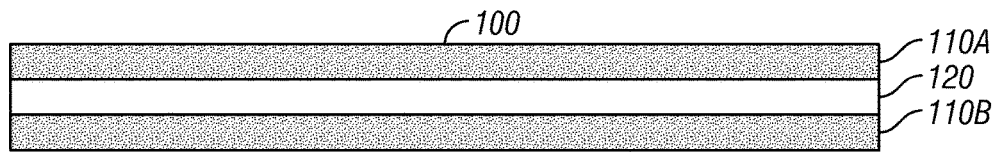
FIG. 1 illustrates a cross-section of a carbon-fiber chassis in accordance with one embodiment of the present disclosure.

Preferred embodiments and their advantages are best understood by reference to FIGS. 1-10, wherein like numbers are used to indicate like and corresponding parts.

For the purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components or the information handling system may include one or more disk drives, one or more network ports for communicating with external devices as well as various input and output (I/O) devices, such as a keyboard, a mouse, touchscreen and/or a video display. The information handling system may also include one or more buses operable to transmit communication between the various hardware components.

An information handling system chassis may be constructed of many different materials, including, for example, a multi-layered carbon-fiber composite. Carbon-fiber composite may be used because of its high strength-to-weight ratio. For example, carbon-fiber composites may be used to provide a light-weight, durable chassis for a laptop computer, tablet computer, or mobile device. Additionally, carbon-fiber composites may be used for the chassis of a desktop computer, server, or network storage device.

An important consideration in the operation of an information handling system is cooling the interior of the chassis. This may be accomplished through the use of air movers (e.g., cooling fans and blowers) in conjunction with vents, which permit air circulation through the chassis. Forming vents in a carbon-fiber chassis may, however, be more difficult than in a chassis of another material. For example, most metals are formed from crystalline structures, which have natural fracture lines. When machined, the crystalline structures tend to break away from the remainder of the material in somewhat uniform bits. A carbon-fiber composite, on the other hand, is formed from multiple layers of a carbon-fiber material, each of which includes many individual carbon fibers. When a carbon-fiber composite is machined, individual carbon fibers may be severed along the edge of the machined hole or slot, creating a rough, or ragged, surface as compared to the surfaces of a slot or hole machined in a metal chassis.

In the context of a vent formed in a carbon-fiber composite, these rough surfaces may result in the turbulent flow of air through the vents, which may reduce the efficiency of the vents. Additionally, when a portion of the individual carbon fibers are severed, the carbon-fiber composite along the edge of the vents may be weakened, which may result in cracking or crumbling of the material between or adjacent to the vents. To reduce the impact of these issues, vents may be formed as micro-channels in the carbon-fiber composite. Where the vents are formed as micro-channels, each vent may be aligned with a single carbon fiber; which may reduce the number of fibers that are severed during the formation of the vents. Embodiments in which the vents are formed as micro-channels in the carbon-fiber composite are discussed in detail in conjunction with FIGS. 4-8. Alternatively, machining vents in the carbon-fiber composite may be avoided altogether by forming the vents in a non-carbon fiber insert, which may be bonded to the chassis. Embodiments in which the vents are formed in an insert are discussed in detail in conjunction with FIGS. 9 and 10.

A multi-layered carbon-fiber composite used to construct the chassis of an information handling system may, in some embodiments, have between three and ten layers, including both polymer and carbon-fiber layers. For example, FIG. 1 illustrates a cross-section of a multi-layered carbon-fiber composite 100, which may include a polymer layer 120 sandwiched between a first carbon-fiber layer 110A and a second carbon-fiber layer 110B. The carbon-fiber layers 110 may be unidirectional carbon-fiber cloth impregnated with a polymer, such as epoxy, polyester, vinyl ester, or nylon. In certain embodiments, carbon-fiber layers 110 may include a carbon-fiber loading of less than thirty percent. Polymer layer 120, which may be included to provide rigidity, may be a polymer such as epoxy, polyester, vinyl ester, or nylon.

Figure 2:
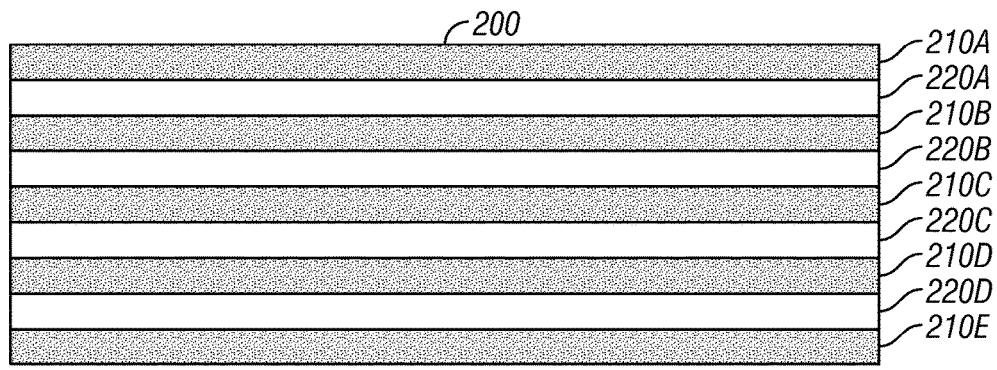
FIG. 2 illustrates a cross-section of a carbon-fiber chassis in accordance with another embodiment of the present disclosure.

As another example, FIG. 2 illustrates a cross-section of multi-layered carbon-fiber composite 200 including nine layers. As with composite 100, the outermost layers 210A and 210E of composite 200 may be carbon-fiber layers. Composite 200 may include alternating carbon-fiber layers (layers 210A, 210B, 210C, 210D, and 210E) and polymer layers (layers 220A, 220B, 220C, and 220D). Carbon-fiber layers 210 may be unidirectional carbon-fiber cloth impregnated with a polymer, such as epoxy, polyester, vinyl ester, or nylon. In certain embodiments, carbon-fiber layers 210 may include a carbon-fiber loading of less than thirty percent. Polymer layers 220 may be a polymer such as epoxy, polyester, vinyl ester, or nylon.

Figure 3:
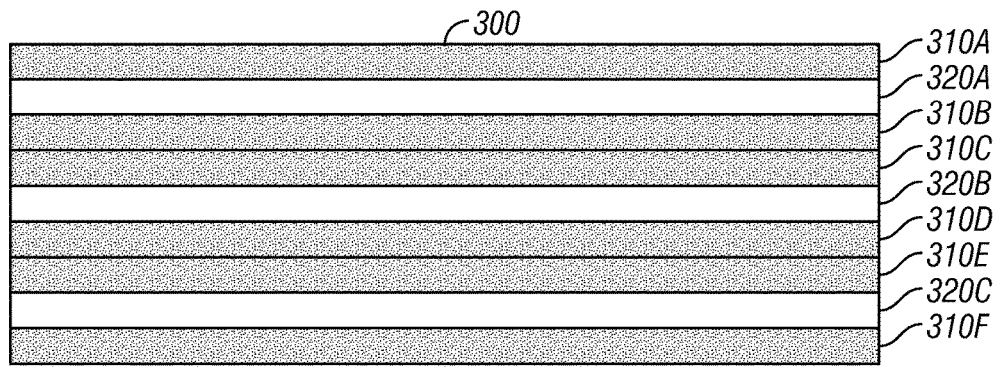
FIG. 3 illustrates a cross-section of a carbon-fiber chassis in accordance with another embodiment of the present disclosure.

As a further example, FIG. 3 illustrates an alternative embodiment of a multi-layered carbon-fiber composite 300. Like composites 100 and 200, composite 300 may include carbon-fiber layers 310 and polymer layers 320. The outermost layers 310A and 310F may be carbon-fiber layers. In certain embodiments, carbon-fiber layers 310 may include a carbon-fiber loading of less than thirty percent. Polymer layers 320 may be a polymer such as epoxy, polyester, vinyl ester, or nylon. The interior layers of composite 300 may alternate between a single polymer layer 320 and two carbon-fiber layers 310. Although not illustrated, a multi-layered carbon-fiber composite used to form a chassis may include other variations of alternating carbon-fiber and polymer layers. Regardless of the number of layers included in the composite, the overall thickness of a multi-layer carbon-fiber composite used for form a chassis may, in some embodiments, be between 0.5 millimeters and 2.0 millimeters.

Figure 4:
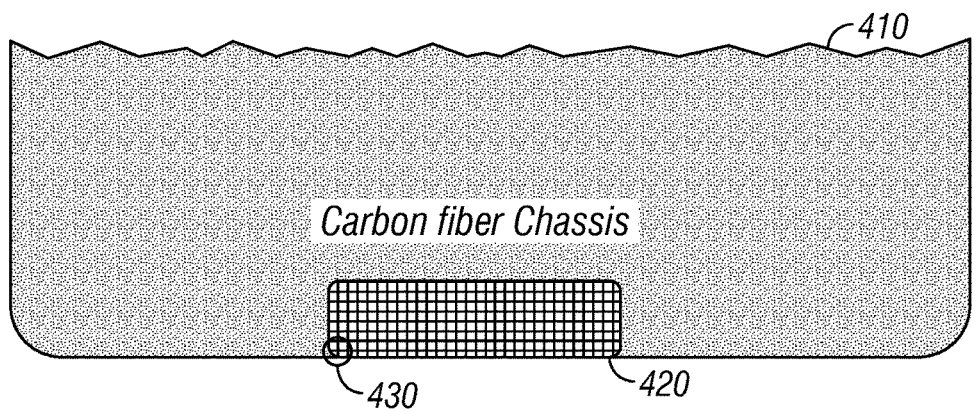
FIG. 4 illustrates a portion of a carbon-fiber chassis in accordance with one embodiment of the present disclosure.

FIG. 4 illustrates a portion of a chassis 410 in which vents have been formed in the chassis itself. Chassis 410 may include a vent area 420 including a plurality of vents 430. Vents 430 may be a series of slots or holes in a surface or wall of chassis 410. Air may flow through vents 430 via forced or natural convection. The dimensions of vent area 420 may depend on the spacing and size of vents 430.

In some embodiments, vents 430 may be organized in substantially parallel rows, as shown in FIG. 4, with a center-to-center spacing (or pitch) of approximately forty microns. In other embodiments, vents 430 may be more or less widely dispersed over the surface of chassis 410. As discussed above, each vent 430 may be aligned with a single carbon fiber to reduce the number of fibers that may be severed during the formation of the vents 430. Additionally, vents 430 may be sized to prevent dust particles, which may be between twenty and thirty microns in diameter, from entering chassis 410 through vents 430. Thus, to prevent dust from entering chassis 410, vents 430 may have a width or diameter less than twenty microns. Vents 430 with a width or diameter less than twenty microns may also be desirable because vents 430 of this size may not visible to the human eye, which may be unable to detect structures and/or objects smaller than approximately fifty microns.

Vents 430 may be formed by laser drilling (which may also be referred to as laser ablation), chemical etching, and/or gradient stamping (e.g., the use of an array of conical cutting elements to puncture a given material, thereby creating a plurality of holes). These methods may result in vents 430 with substantially smoother surfaces than those produced through traditional machining processes.

Figure 5:
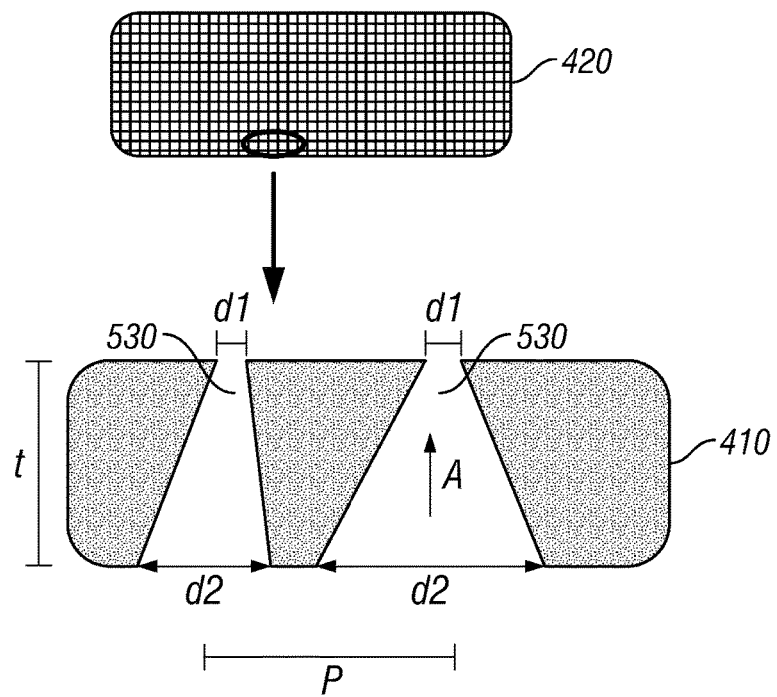
FIG. 5 illustrates a cross-section of a portion of a carbon-fiber chassis in accordance with one embodiment of the present disclosure.
Figure 6:
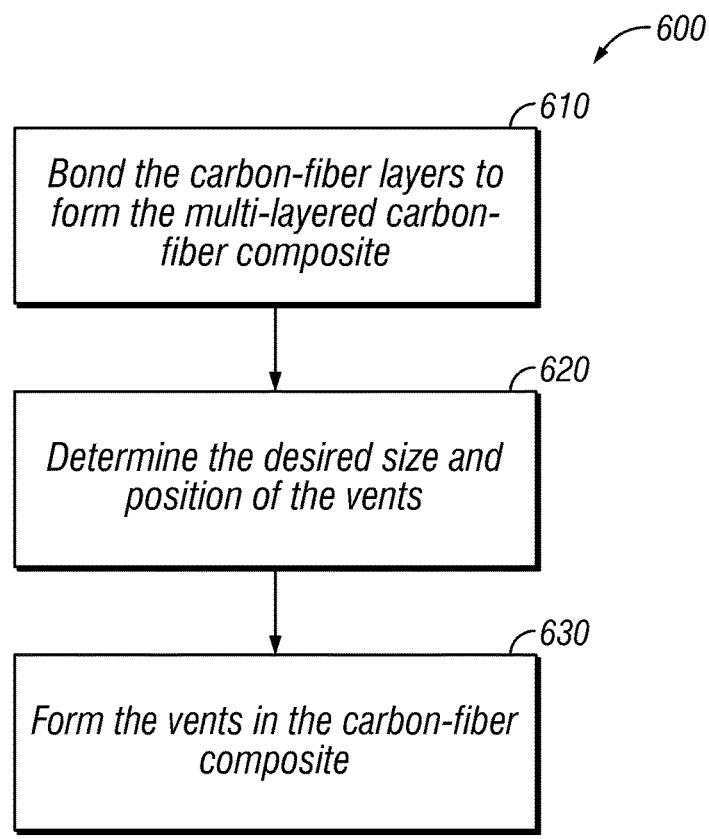
FIG. 6 illustrates a method of forming a carbon-fiber chassis including in accordance with one embodiment of the present disclosure.

In some embodiments, which are discussed in further detail in conjunction with FIGS. 5 and 6, vents 430 may be conical micro-channels extending through chassis 410. In other embodiments, which are discussed in further detail in conjunction with FIGS. 7-8, vents 430 may be cylindrical micro-channels extending through chassis 410.

FIG. 5 illustrates a cross section of a portion of chassis 410 including conical vents 530 formed in chassis 410. The portion of chassis 410 shown in FIG. 5 includes two vents 530. Arrow A may represent air flow through vents 530 from the interior of chassis 410 to the exterior of chassis 410. To prevent dust from entering chassis 410, the smallest diameter (d1) of conical vents 530 may be less than twenty microns. To reduce friction between the walls of vents 530 and air flowing through vents 530, the ratio between the thickness (t) of the composite used to form chassis 410 and the maximum diameter (d2) of vents 530 may be greater than or equal to one hundred. Thus, a chassis 410 formed of a material with a thickness of two millimeters may include vents 530 with a maximum diameter of less than or equal to twenty microns, while a chassis 410 formed of a material with a thickness of one millimeters may include vents 530 with a maximum diameter of less than or equal to ten microns. As discussed above, in some embodiments, vents 530 may have a with a center-to-center spacing, also referred to as pitch (p), of approximately forty microns.

FIG. 6 illustrates an example method 600 of forming a chassis including conical vents formed in the multi-layered carbon fiber composite of the chassis. The method may begin at step 610. At step 610, the carbon-fiber layers may be bonded to form a multi-layered carbon-fiber composite. The carbon fiber layers may be laminated using a polymer, such as epoxy, polyester, vinyl ester, or nylon. The polymer used to laminate the carbon fiber layers may form the polymer layers of the carbon-fiber composite. When the carbon-fiber composite has been formed, the method may proceed to step 620.

At step 620, the desired size and position of the vents may be determined. As discussed above, each vent may be aligned with a single carbon fiber to reduce the number of fibers that may be severed during the formation of the vents. Additionally, vents may be sized to prevent dust from entering the chassis through the vents and/or sized so as to be undetectable by a human eye. At step 630, the vents may be formed in the carbon-fiber composite. As discussed above, the vents may be formed by laser drilling, chemical etching, and/or gradient stamping.

Figure 7:
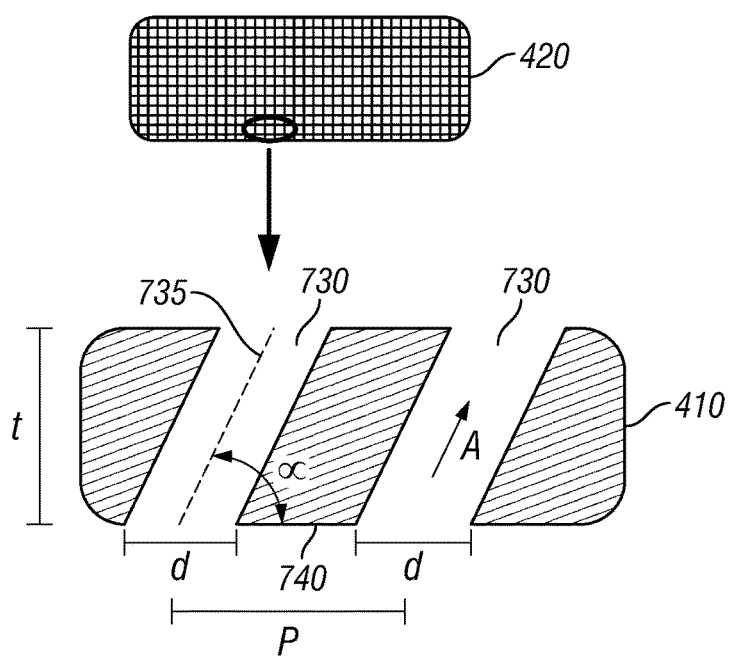
FIG. 7 illustrates a cross-section of a portion of a carbon-fiber chassis in accordance with another embodiment of the present disclosure.

As discussed above, vents may also be formed as cylindrical micro-channels extending through chassis 410. FIG. 7 illustrates a cross-section of a portion of chassis 410 includes cylindrical vents 730. The portion of chassis 410 shown in FIG. 7 includes two vents 730. Arrow A may represent air flow through vents 730 from the interior of chassis 410 to the exterior of chassis 410. To prevent dust from entering chassis 410, the diameter (d) of vents 730 may be less than twenty microns. To reduce friction between the walls of vents 730 and air flowing through vents 730, the ratio between the thickness (t) of the composite used to form chassis 410 and the diameter (d) of vents 730 may be greater than or equal to one hundred. Thus, a chassis 410 formed of a material with a thickness of two millimeters may include vents 730 with a maximum diameter of less than or equal to twenty microns, while a chassis 410 formed of a material with a thickness of one millimeters may include vents 730 with a maximum diameter of less than or equal to ten microns.

Unlike conical vents 530 shown in FIG. 5, which have a center axis oriented approximately perpendicular to an interior or exterior surface of chassis 410, cylindrical vents 730 may have a center axis 735 oriented less than ninety degrees from an interior surface 740 of chassis 410. The angle between center axis 735 of and interior surface 740 may be represented by the angle α, which is shown in FIG. 7. Cylindrical vents 730 may be oriented in this manner to aid in preventing dust particles from entering chassis 410. For example, a dust particles that is oblong in shape may enter chassis 410 through conical vents 530 so long as the smallest diameter of the dust particle is less than twenty microns. The same oblong dust particle may, however, not be able to enter chassis 410 through cylindrical vents 730 without rotating or changing direction. Thus, the orientation of vents 730 may aid in preventing dust particles from entering chassis 410.

Figure 8:
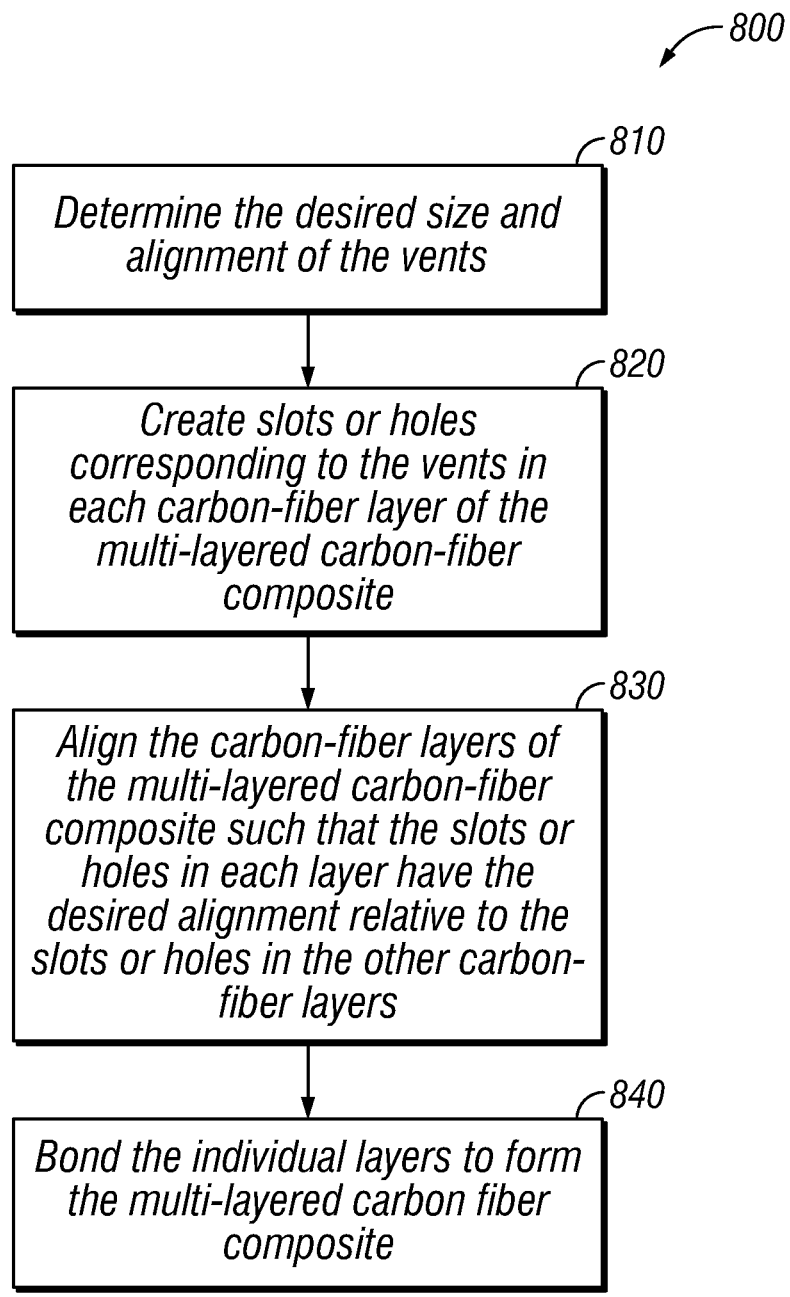
FIG. 8 illustrates a method of forming a carbon-fiber chassis in accordance with another embodiment of the present disclosure.

FIG. 8 illustrates an example method 800 of forming cylindrical vents in a multi-layered carbon-fiber composite. To achieve the desired orientation of the vents with respect to an interior or exterior surface of chassis 410, holes corresponding to each vent may be formed in each carbon-fiber layer of the multi-layered composite before the layers are bonded. The layers may then be aligned such that the center axis of each hole in a carbon-fiber layer is offset from the center-axis of each hole in an adjacent layer. By offsetting the holes in each layer, a cylindrical vent with a center axis oriented less than ninety degrees from an interior surface of chassis 410 may be formed.

The method 800 may begin at step 810. At step 810, the desired size and orientation of the vents may be determined. Based on the desired orientation of the center axis of the vents, an offset for the holes may be calculated. In some embodiments, the holes may be offset such that the holes in a particular layer overlap the corresponding holes in an adjacent layer by at least thirty percent. In other embodiments, the holes may be offset such that the holes in a particular layer overlap the corresponding holes in an adjacent layer by not more than seventy percent. Where the holes in adjacent layers have an overlap of seventy percent, the angle α may be greater than if the holes in adjacent layers have an overlap of thirty percent. Once the desired size and orientation of the vents is determined, the method may proceed to step 620.

At step 620, the holes corresponding to the cylindrical vents may be formed in the carbon-fiber layers of the multi-layered carbon-fiber composite. This step may occur before the layers of the multi-layered carbon-fiber composite are bonded. As discussed above, the holes corresponding to the vents may be formed by laser drilling, chemical etching, and/or gradient stamping. After the holes corresponding to the vents are formed, the method may proceed to step 630.

At step 630, the layers of the multi-layered carbon-fiber composite may be aligned such that the holes in each layer have the desired offset relative to the holes in adjacent layers. As discussed above, in some embodiments, the holes may be offset such that the holes in a particular layer overlap the corresponding holes in an adjacent layer by at least thirty percent. In other embodiments, the holes may be offset such that the holes in a particular layer overlap the corresponding holes in an adjacent layer by not more than seventy percent. Once the layers have been aligned, the method may proceed to step 640. At step 640, the layers may be bonded to form a multi-layered carbon-fiber composite. In some embodiments, the carbon fiber layers may be laminated using a polymer, such as epoxy, polyester, vinyl ester, or nylon. The polymer used to laminate the carbon fiber layers may form the polymer layers of the carbon-fiber composite.

Figure 9:
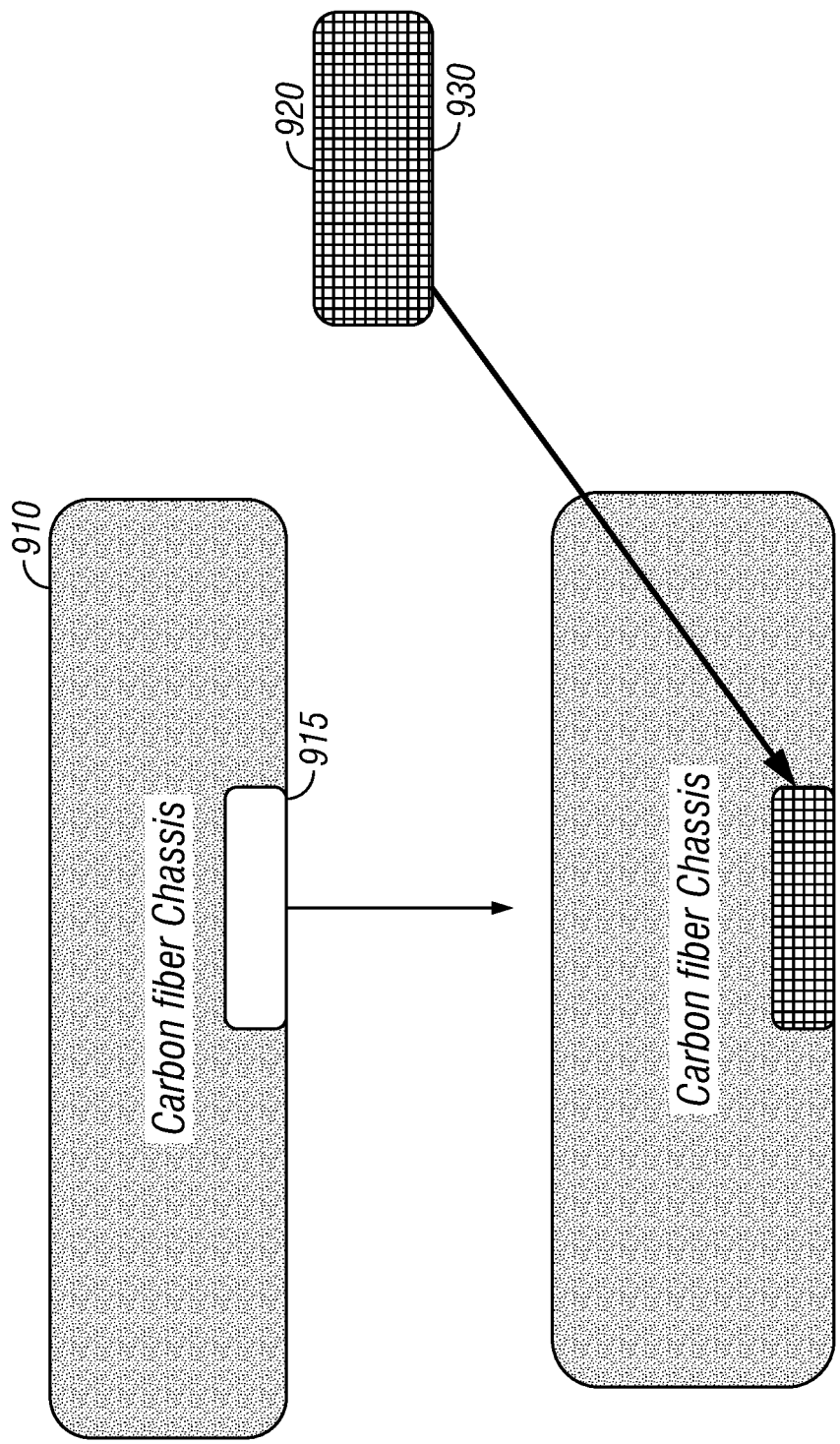
FIG. 9 illustrates a portion of a carbon-fiber chassis in accordance with yet another embodiment of the present disclosure.

As discussed above, machining vents directly in the carbon-fiber composite of a chassis may be avoided altogether by forming the vents in a non-carbon fiber insert, which may be bonded to the chassis. FIG. 9 illustrates such an embodiment. Chassis 910 may include a vent area 920 formed as an insert and bonded to chassis 910. Vent area insert 920 may be received by cutout 915, which may extend through chassis 910. Cutout 915 may be formed using traditional machining methods or, as discussed above with respect to the formation of vents 430, through the use of laser drilling, chemical etching, and/or gradient stamping.

Vent area insert 920 may be formed of a glass-filled nylon, polycarbonate, metal, or other material that may be bonded to the multi-layered carbon-fiber composite used to form chassis 910. Vent area insert 920 may include a plurality of vents 930, which may be a series of cylindrical or conical micro-channels in vent area insert 920. The dimensions of vent area insert 920 may depend on the spacing and size of vents 930. As discussed above, vents 930 may have a width or diameter of less than twenty microns to prevent dust from entering chassis 910 through vents 930. Additionally, as discussed above with respect to vents 530 and vents 730, vents 930 may have a center-to-center spacing, or pitch (p), of approximately forty microns or may be more or less widely dispersed. Vents 930 may be formed using traditional machining methods or, as discussed above with respect to the formation of vents 530 and 730, vents 930 may be formed through the use of laser drilling, chemical etching, and/or gradient stamping.

Vent area insert 920 may be coupled to chassis 910 using an insert molding machine. For example, the multi-layered carbon-fiber composite of chassis 910, together with vent area insert 920, may be placed in an insert molding machine and bonded using a polymer resin.

Figure 10:
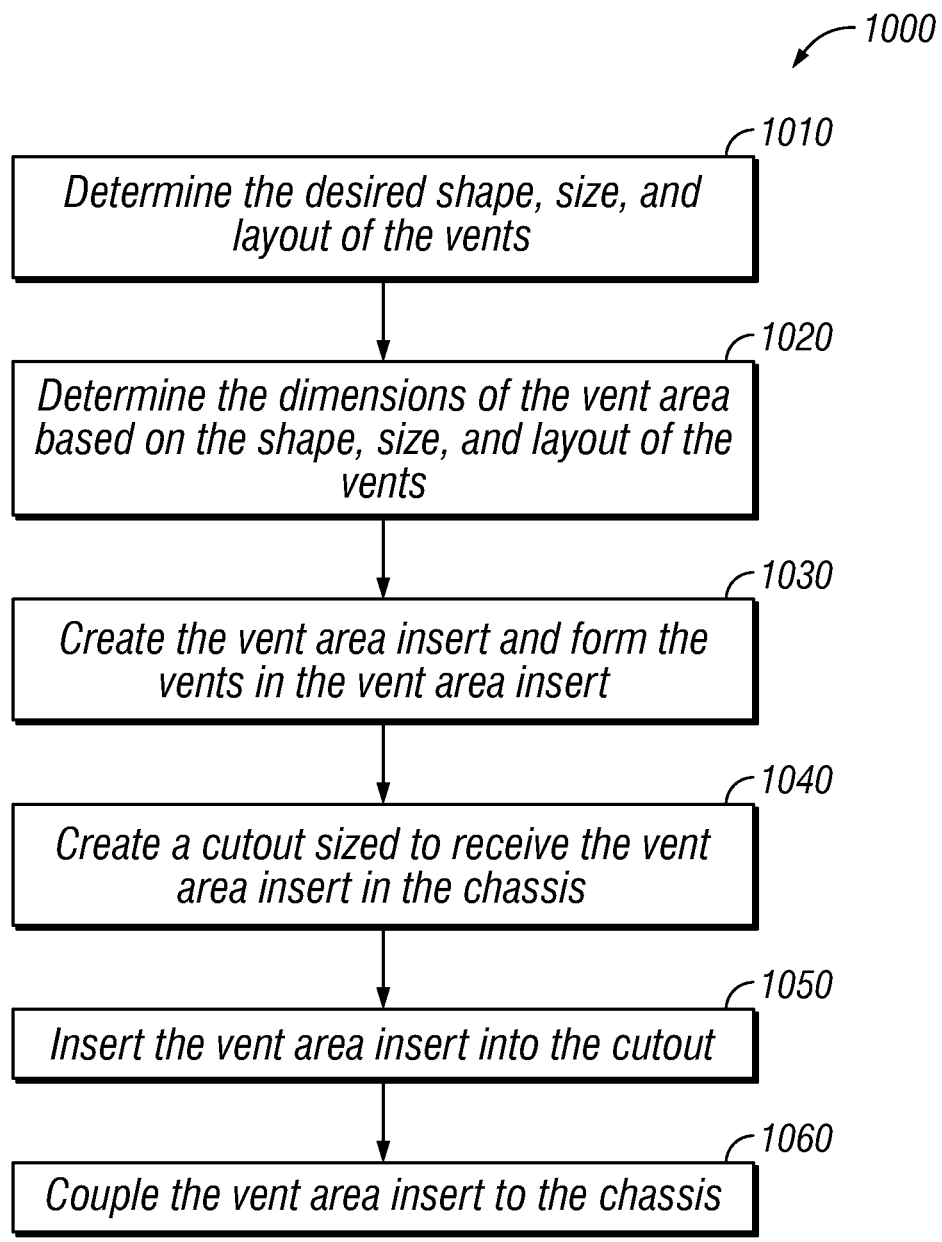
FIG. 10 illustrates a method of forming a carbon-fiber chassis in accordance with yet another embodiment of the present disclosure.

FIG. 10 illustrates an example method 1000 of forming a multi-layered carbon-fiber chassis including a vent area insert. The method 1000 may begin at step 1010. At step 1010, the desired shape, size, and layout of the vents in the vent area may be determined. As discussed above, vents may be a conical or cylindrical micro-channels extending through the material of the vent area insert. The vents may be sized to prevent dust from entering the chassis through the vents and/or sized so as to be undetectable by a human eye. Additionally, as discussed above, the vents may be arranged with a center-to-center spacing (or pitch) of approximately forty microns, or may be more or less widely dispersed. Once the desired shape, size, and layout of the vents is determined, the method may proceed to step 1020.

At step 1020, the dimensions of the vent area insert may be determined. As discussed above, the dimensions of the vent area insert may depend on the spacing and size of the vents. After the dimensions of the vent area insert have been determined, the method may proceed to step 1030. At step 1030, the vent area insert may be created and the vents may be formed in the material of the vent area insert. As discussed above, the vent area insert may be formed of a glass-filled nylon, polycarbonate, metal, or other material capable of bonding to the carbon-fiber composite of the chassis. The vents may be formed using traditional machining methods or through the use of laser drilling, chemical etching, and/or gradient stamping.

At step 1040, a cutout sized to receive the vent area insert may be formed in the carbon-fiber composite of the chassis. At step 1050, the vent area insert may be inserted into the cutout such that the vent area insert extends though the carbon-fiber composite of the chassis. At step 1060, the vent area insert may be coupled to the chassis. As discussed above, the multi-layered carbon-fiber composite of the chassis, together with the vent area insert, may be placed in an insert molding machine and bonded using a polymer resin.

Although the present disclosure has been described in detail, it should be understood that various changes, substitutions, and alterations can be made hereto without departing from the spirit and the scope of the disclosure as defined by the appended claims. For example, the methods disclosed herein may be used to form vents in a glass-fiber or polymeric-fiber composite. Additionally, the methods disclosed herein may be used for form a chassis for other systems in which vents may be used to facilitate air flow through the system.

What is claimed is:

1. A chassis of an information handling system, the chassis comprising:
   a carbon-fiber composite;
   a vent area insert coupled to the carbon-fiber composite; and
   a plurality of vents formed in the vent area insert, wherein each of the plurality of vents is a channel extending through the vent area insert and a ratio between a thickness of the carbon-fiber composite and a diameter of each of the plurality of vents is greater than one hundred.

2. The chassis of claim 1, the vent area comprising a glass-filled nylon insert.

3. The chassis of claim 1, wherein a diameter of each of the plurality of vents is less than 20 microns.

4. The chassis of claim 1, wherein a thickness of the carbon-fiber composite is at least 0.5 millimeters and not more than 2.0 millimeters.

5. A method of manufacturing a chassis of an information handling system, the method comprising:
   creating a vent area insert including a plurality of vents extending through the vent area insert;
   creating a cutout in a carbon-fiber composite, the cutout sized to receive the vent area insert;
   inserting the vent area insert into the cutout in the carbon-fiber composite; and
   coupling the vent area insert to the carbon-fiber composite;
   wherein a ratio between a thickness of the carbon-fiber composite and a diameter of each of the plurality of vents is greater than one hundred.

6. The method of claim 5, wherein each of the plurality of vents comprises a conical channel or a cylindrical channel with a diameter of less than 20 microns.

* * * * *